(12) United States Patent
Tsukamoto et al.

(10) Patent No.: US 9,991,180 B2
(45) Date of Patent: Jun. 5, 2018

(54) SEMICONDUCTOR DEVICE FOR REDUCING SELF-INDUCTANCE

(71) Applicant: Mitsubishi Electric Corporation, Tokyo (JP)

(72) Inventors: Hideki Tsukamoto, Tokyo (JP); Mituharu Tabata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 14/963,701

(22) Filed: Dec. 9, 2015

(65) Prior Publication Data

US 2016/0307813 A1    Oct. 20, 2016

(30) Foreign Application Priority Data

Apr. 16, 2015    (JP) .................................. 2015-083847

(51) Int. Cl.
*H01L 23/043*    (2006.01)
*H01L 25/07*    (2006.01)

(52) U.S. Cl.
CPC ............ H01L 23/043 (2013.01); H01L 25/07 (2013.01); *H01L 2924/13055* (2013.01); *H01L 2924/30107* (2013.01)

(58) Field of Classification Search
CPC .................. H01L 23/043; H01L 25/07; H01L 2924/30107; H01L 2924/13055
See application file for complete search history.

(56) References Cited

U.S. PATENT DOCUMENTS

| 8,736,043 B2 | 5/2014 | Konno et al. |
| 2006/0071860 A1 | 4/2006 | Hozoji et al. |
| 2011/0249421 A1* | 10/2011 | Matsuo .................. B60K 6/445 361/821 |

(Continued)

FOREIGN PATENT DOCUMENTS

| CN | 1758522 A | 4/2006 |
| CN | 102484109 A | 5/2012 |

(Continued)

OTHER PUBLICATIONS

An Office Action; "Notification of Reasons for Refusal," mailed by the Japanese Patent Office dated Jan. 30, 2018, which corresponds to Japanese Patent Application No. 2015-083847 and is related to U.S. Appl. No. 14/963,701; with its English translation.

(Continued)

*Primary Examiner* — Steven Loke
*Assistant Examiner* — Juanita Rhodes
(74) *Attorney, Agent, or Firm* — Studebaker & Brackett PC

(57) ABSTRACT

A semiconductor device includes: a resin case that houses a semiconductor element; a parallel plate that is disposed inside the resin case while being connected with the semiconductor element, the parallel plate including two flat plates parallel to each other with an insulating material therebetween; two electrodes that are each led out from two electrode lead-out portions in an upper end of the parallel plate and are disposed on an upper surface of the resin case at a predetermined interval; and a metal plate that stands erect on the main surface of the flat plate in a region at the predetermined interval between the two electrode lead-out portions.

18 Claims, 6 Drawing Sheets

(56) References Cited

U.S. PATENT DOCUMENTS

| | | |
|---|---|---|
| 2012/0181682 A1 | 7/2012 | Soyano |
| 2012/0211767 A1 | 8/2012 | Kawanami et al. |
| 2012/0256194 A1 | 10/2012 | Yoshihara et al. |
| 2016/0284618 A1* | 9/2016 | Tsukamoto ........... H01L 23/055 |

FOREIGN PATENT DOCUMENTS

| | | |
|---|---|---|
| JP | 2013-021107 A | 1/2013 |
| WO | 2014/192118 A1 | 12/2014 |

OTHER PUBLICATIONS

An Office Action issued by Chinese Patent Office dated Jan. 29, 2018, which corresponds to Chinese Patent Application No. 201610237319.5 and is related to U.S. Appl. No. 14/963,701; with English translation.

* cited by examiner

F I G. 1 1
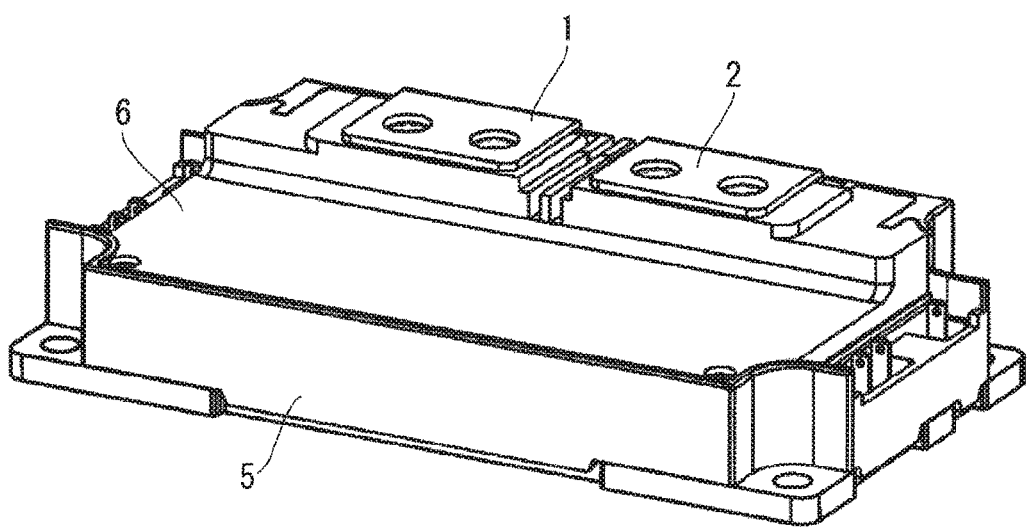
F I G. 1 2
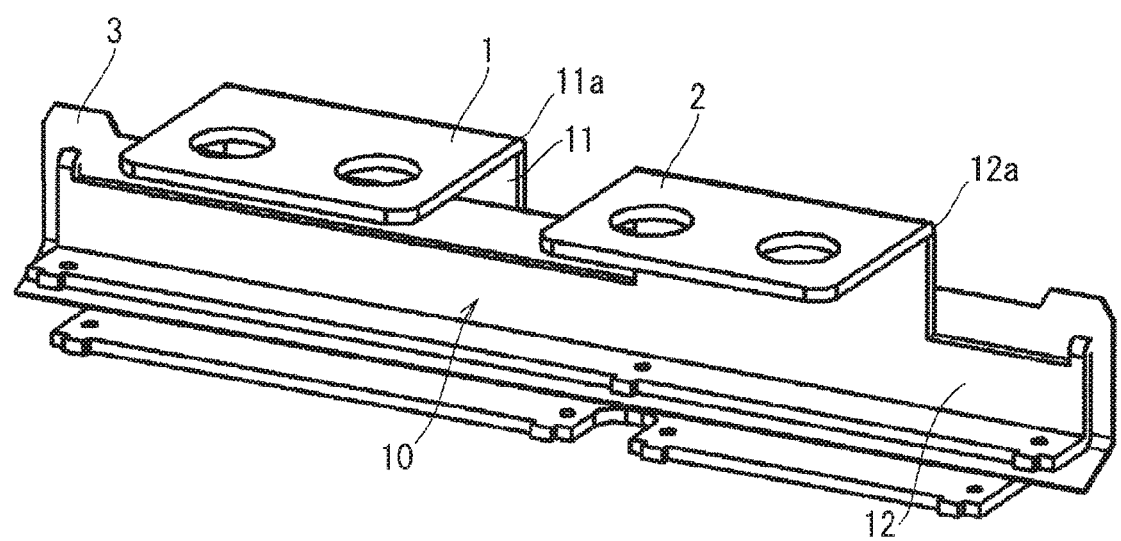

SEMICONDUCTOR DEVICE FOR REDUCING SELF-INDUCTANCE

BACKGROUND OF THE INVENTION

Field of the Invention

The present invention relates to a reduction in a self-inductance of a semiconductor device.

Description of the Background Art

Power modules such as IGBT modules and SiC modules have a configuration in which a plurality of terminals (electrodes) are disposed such that total currents cancel each other out to be approximately zero. In such a configuration, to reduce a self-inductance of a semiconductor device, the plurality of terminals are disposed close to each other with an insulating material therebetween and the close portions of the plurality of terminals are disposed in parallel (refer to Japanese Patent Application Laid-Open No. 2013-21107, for example).

However, the terminals for connection with external circuits need to be open to the outside from an insulating resin case, and the plurality of terminals need to be disposed at an interval to secure a creepage distance. Alternatively, irregularities are provided on an upper surface of the resin case to secure the creepage distance, so that the self-inductance of the semiconductor device is hardly reduced beyond a certain degree.

SUMMARY OF THE INVENTION

It is an object of the present invention to provide a semiconductor device capable of reducing a self-inductance.

A semiconductor device according to the present invention includes a resin case that houses a semiconductor element, a parallel plate, two electrodes, and a metal plate. The parallel plate is disposed inside the resin case while being connected with the semiconductor element, the parallel plate including two flat plates parallel to each other with an insulating material therebetween. The two electrodes are each led out from two electrode lead-out portions in an upper end of the parallel plate and are disposed on an upper surface of the resin case at a predetermined interval. The metal plate stands erect on the main surface of the flat plate in a region at a predetermined interval between the two electrode lead-out portions.

The metal plate stands erect on the main surface of the flat plate in a region at the predetermined interval between the two electrode lead-out portions. Although magnetic flux easily concentrates in a portion between the two electrode lead-out portions in the parallel plate, the concentration of the magnetic flux is relieved by arranging the metal plate in the above region, and thus the self-inductance of the semiconductor device can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a perspective view of a semiconductor device according to an underlying technology; and FIG. 12 is a perspective view of a parallel plate and electrodes of the semiconductor device according to the underlying technology.

DESCRIPTION OF THE PREFERRED EMBODIMENTS

First Preferred Embodiment

Figure 1:
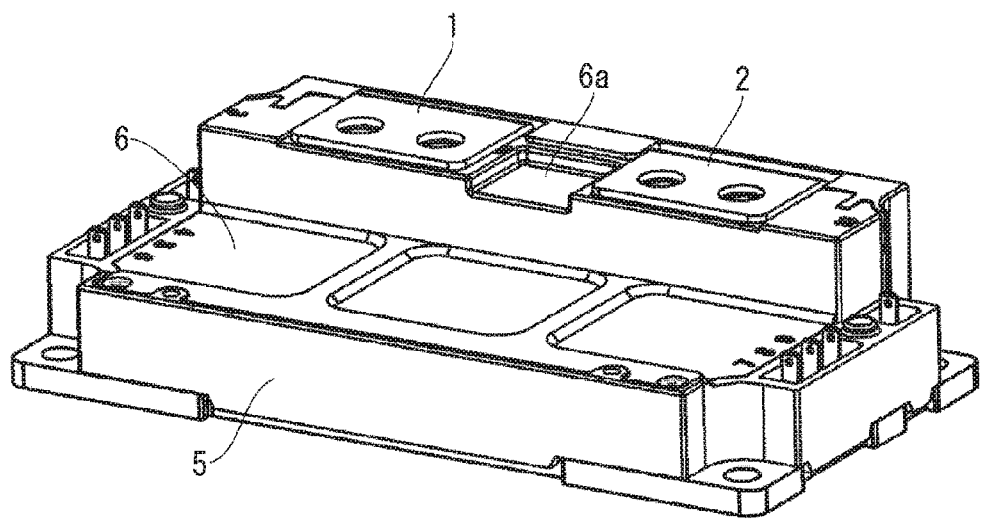
FIG. 1 is a perspective view of a semiconductor device according to a first preferred embodiment.
Figure 2:
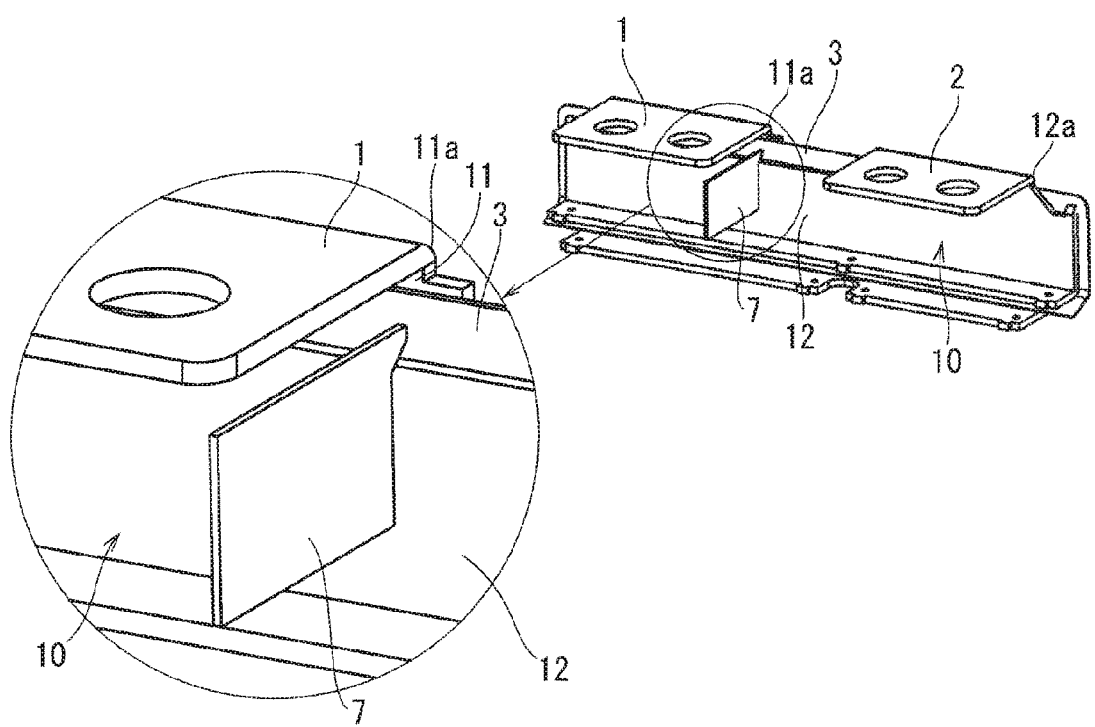
FIG. 2 is a perspective view of a parallel plate and electrodes of the semiconductor device according to the first preferred embodiment.

A first preferred embodiment of the present invention is described below with reference to the drawings. FIG. 1 is a perspective view of a semiconductor device according to the first preferred embodiment. FIG. 2 is a perspective view of a parallel plate 10, an electrode 1, and an electrode 2 of the semiconductor device according to the first preferred embodiment.

As shown in FIGS. 1 and 2, the semiconductor device is a power module such as an IGBT module or a SiC module and includes a resin case 5, the parallel plate 10, the electrodes 1 and 2, and a metal plate 7. The resin case 5 formed in a box houses a semiconductor element (not shown) therein. The resin case 5 has an upper surface of a rear portion positioned higher than an upper surface of a front portion. A lid 6 is disposed on an upper end portion of the front portion of the resin case 5, and the lid 6 forms the upper surface of the front portion of the resin case 5.

The parallel plate 10 is disposed inside the rear portion of the resin case 5 while being connected with the semiconductor element. The parallel plate 10 includes two flat plates 11 and 12 parallel to each other with an insulating material 3 therebetween. The flat plate 11 is formed to extend in a width direction of the resin case 5 and is disposed such that a main surface faces the front or the rear. The electrode 1 is led out from an upper end (electrode lead-out portion 11a) of a left end portion in the width direction of the flat plate 11 toward the front. The flat plate 12 is formed to extend in the width direction of the resin case 5 and is disposed such that a main surface faces the front or the rear. The electrode 2 is led out from an upper end (electrode lead-out portion 12a) of a right end portion in the width direction of the flat plate 12 toward the front. The electrode 1 and the electrode 2 are disposed on the upper surface of the rear portion of the resin case 5 at a predetermined interval, and a lid 6a is disposed between the electrode 1 and the electrode 2 on an upper end portion of the rear portion of the resin case 5.

The metal plate 7 is made up of a non-magnetic material such as copper or aluminum alloy and is independent from the electrodes 1 and 2. A skin depth of the metal plate 7 at 1 MHz is equal to or less than a thickness of the metal plate 7. The thickness of the metal plate 7 is formed to be smaller than the electrode 1. The metal plate 7 stands erect on the main surface of the flat plate 12 in a region at a predetermined interval between the two electrode lead-out portions 11a and 12a. More particularly, the metal plate 7 is disposed and fixed perpendicular to the main surface of the flat plate 12 with a distance of 1 mm or less (for example, 0.1 mm-1 mm) between a rear surface of the electrode 1 and an upper end of the metal plate 7 at a position on the flat plate 12 corresponding to an end portion of the electrode 1 at the side of the electrode 2. Thus, a vertical surface of the metal plate 7 faces in a width direction (horizontal direction) of the semiconductor device. By disposing the metal plate 7 in the region at the predetermined interval between the two electrode lead-out portions 11a and 12a, a concentration of magnetic flux in the above portion can be relieved and thus, a self-inductance of the semiconductor device can be reduced. The metal plate 7 may also be disposed at a position on the flat plate 12 corresponding to an end portion of the electrode 2 at the side of the electrode 1.

Frequency band of a phenomenon which is affected by the self-inductance is substantially 10 MHz or more, so that when an effect is produced at 1 MHz, a sufficient effect can be expected for a main purpose. A metal plate has a property of preventing an intrusion of high frequency magnetic flux within a limit of skin effect, so that when a non-magnetic metal plate having conductivity of at least 10% IACS is disposed, the concentration of the magnetic flux can be relieved. It is simply conceivable that an increased surface of a metal plate is effective. However, as a result of repeated detailed electromagnetic field simulations performed by the inventor of the present invention, it is found that the effect is reduced when the metal plate is not disposed at least close to a base end of the electrode, that is to say, it is necessary to arrange part of the metal plate close to the base end portion of the electrode.

Next, effects obtained from the semiconductor device according to the first preferred embodiment are described in comparison with a semiconductor device according to an underlying technology. FIG. 11 is a perspective view of the semiconductor device according to the underlying technology. FIG. 12 is a perspective view of a parallel plate 10 and electrodes 1 and 2 of the semiconductor device according to the underlying technology.

First, the semiconductor device according to the underlying technology is described. As shown in FIGS. 11 and 12, the semiconductor device according to the underlying technology includes a resin case 5, the parallel plate 10, and the electrodes 1 and 2. A lid 6 is disposed on an upper end portion of a front portion of the resin case 5, and the lid 6 forms an upper surface of the front portion of the resin case 5.

The parallel plate 10 is disposed inside a rear portion of the resin case 5 while being connected with a semiconductor element. The parallel plate 10 includes two flat plates 11 and 12 parallel to each other with an insulating material 3 therebetween. The flat plate 11 is formed to extend in a width direction of the resin case 5 and is disposed such that a main surface faces the front or the rear. The electrode 1 is led out from an upper end (electrode lead-out portion 11a) of a left end portion in the width direction of the flat plate 11 toward the front. The flat plate 12 is formed to extend in the width direction of the resin case 5 and is disposed such that a main surface faces the front or the rear. The electrode 2 is led out from an upper end (electrode lead-out portion 12a) of a right end portion in the width direction of the flat plate 12 toward the front. The electrode 1 and the electrode 2 are disposed on the upper surface of the rear portion of the resin case 5 at a predetermined interval.

Here, in the underlying technology, the distance between the electrode 1 and the electrode 2 is shorter than that in the first preferred embodiment. The reason is that the shorter distance between the electrode lead-out portion 11a and the electrode lead-out portion 12a in the flat plate 10 can reduce a self-inductance of the semiconductor device.

However, as shown in FIG. 11, in the semiconductor device according to the underlying technology, a region 5a corresponding to a portion between the electrode lead-out portions 11a and 12a on the upper surface of the resin case 5 is formed in an uneven shape to secure a creepage distance between the electrode 1 and the electrode 2. For the above reason, the portion of the parallel plate 10 between the electrode lead-out portions 11a and 12a and a bus bar connected with the electrode lead-out portions 11a and 12a have a long distance therebetween, so that a self-inductance of the semiconductor device is hardly reduced beyond a certain degree.

In contrast, in the semiconductor device according to the first preferred embodiment, the metal plate 7 stands erect on the main surface of the flat plate 12 in the region at the predetermined interval between the two electrode lead-out portions 11a and 12a. Although the magnetic flux easily concentrates in a region between the two electrode lead-out portions 11a and 12a in the parallel plate 10, the concentration of the magnetic flux can be relieved by arranging the metal plate 7 in the manner described above, and thus, the self-inductance of the semiconductor device can be reduced.

Since the distance between the metal plate 7 and the electrode 1 is 1 mm or less, a magnetic flux density does not increase easily, and the self-inductance of the semiconductor device can be further reduced. The magnetic flux density does not increase easily in a portion where the two electrodes 1 and 2 are close to each other, that is to say, a portion between the two electrodes 1 and 2. The magnetic flux does not dissipate but circulates, so that when the magnetic flux is induced from a portion where the magnetic flux density does not increase easily to prevent the magnetic flux from flowing toward a portion where the magnetic flux density concentrates, the self-inductance can be totally reduced. Accordingly, when the metal plate 7 is sufficiently brought close to the portion where the two electrodes 1 and 2 are close to each other, the self-inductance can be totally reduced. An electrical potential of the metal plate 7 and the electrode 1 needs to be substantially equal to bring the metal plate 7 close to the electrode 1.

The thickness of the metal plate 7 is smaller than that of the electrode 1, so that an increase in manufacturing cost of the semiconductor device can be suppressed.

Second Preferred Embodiment

Figure 3:
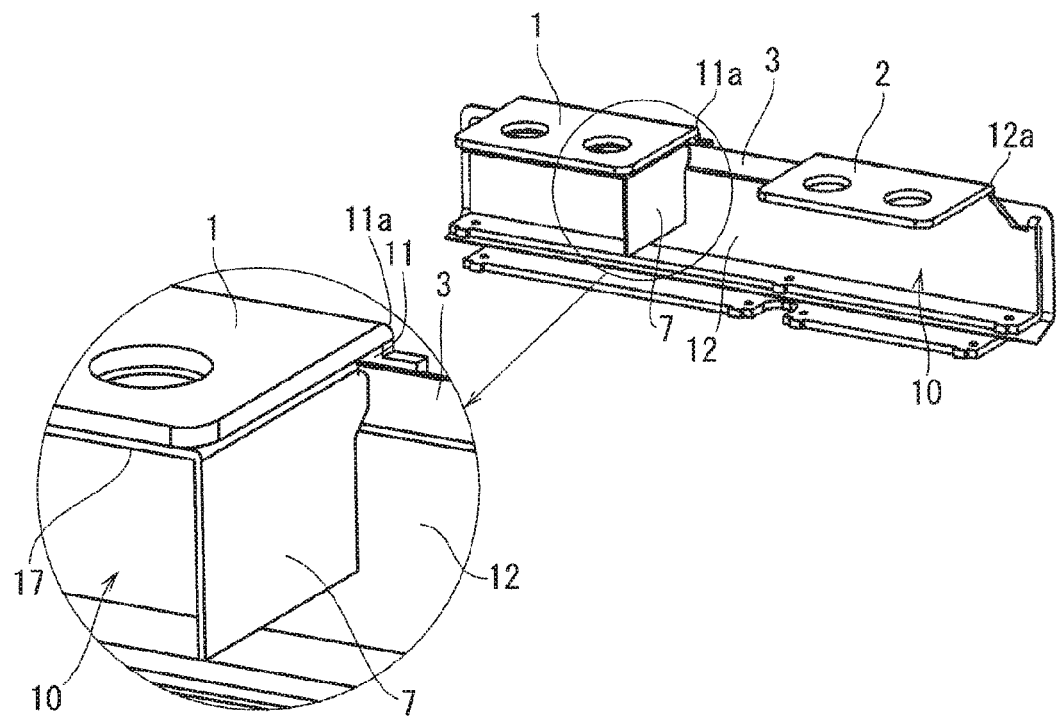
FIG. 3 is a perspective view of a parallel plate and electrodes of a semiconductor device according to a second preferred embodiment.

Next, a semiconductor device according to a second preferred embodiment is described. FIG. 3 is a perspective view of the parallel plate 10 and the electrodes 1 and 2 of the semiconductor device according to the second preferred embodiment. In the second preferred embodiment, the same components as those described in the first preferred embodiment are denoted by the same references, which are not described here.

In the second preferred embodiment, the metal plate 7 is disposed in contact with the rear surface of the electrode 1. A specific description is as follows. The semiconductor device further includes a metal member 17, which is made up of a non-magnetic material such as copper or aluminum alloy. The metal member 17 has a larger outline than the electrode 1 in a plane view, that is to say, the metal member 17 is formed longer than the electrode 1 and is fixed in contact with the rear surface of the electrode 1. The metal plate 7 is composed of part of the metal member 17. More specifically, part of the metal member 17 located at a side of the electrode 2 is vertically bent downward to form the metal plate 7. The metal member 17 including the metal plate 7 is replaceably constituted with respect to the flat plate 12 and the electrode 1.

The metal plate 7 is made up of a material softer than the electrode 1. The reason is that a force of pressing the electrode 1 to an external wiring, which is connected to the electrode 1, is equalized by a deformation of the metal plate 7 so that a contact state between the electrode 1 and the external wiring is enhanced. It is preferable that the metal plate 7 is a non-nickel-plate copper plate when the electrode 1 is a nickel-plated copper plate, metal plate 7 is an annealed copper plate when the electrode 1 is a rolled copper plate, and the metal plate 7 is made up of aluminum alloy when the electrode 1 is made up of copper.

As described above, in the semiconductor device according to the second preferred embodiment, the metal plate 7 is disposed in contact with the electrode 1, so that a leakage of the magnetic flux from a gap between the electrode 1 and the metal plate 7 is suppressed and the self-inductance of the semiconductor device can be further reduced. When the electrode 1 and the metal plate 7 are insulated using an insulating material, a space for arranging the insulating material between the electrode 1 and the metal plate 7 is necessary, thus the magnetic flux is leaked into the space. Moreover, since the metal plate 7 which is not connected to a circuit has an indefinite potential, a deterioration of the insulating material 3 is promoted by a partial discharge. It is preferable to separate the metal plate 7 in a step of integrating the electrode 1 and the resin case 5, which is an insulating housing component, however, it is preferable to electrically connect the electrode 1 and the metal plate 7 in terms of magnetic flux alleviation and deterioration suppression of the insulating material 3.

The semiconductor device further includes the metal member 17 disposed in contact with the rear surface of the electrode 1 with the larger outline than the electrode 1 in a plane view, and the metal plate 7 is composed of the part of the metal member 17, so that a heat radiating effect of the electrode 1 can be enhanced.

The metal plate 7 is replaceably constituted with respect to the flat plate 12, so that structures with both high and low self-inductance reduction effects can be easily achieved by preparing various sizes of metal plate 7.

The metal plate 7 is softer than the electrode 1, so that the contact state between the electrode 1 and the external wiring can be enhanced by equalizing the force of pressing the electrode 1 to the external wiring, resulting from the deformation of the metal plate 7.

Figure 4:
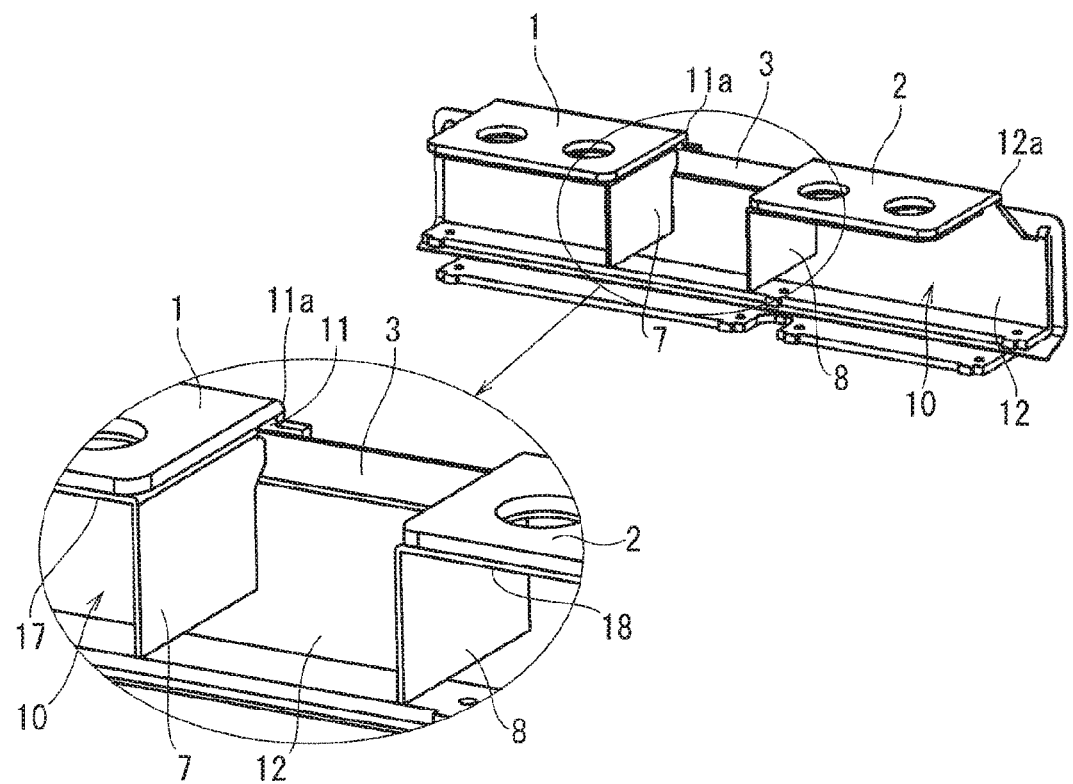
FIG. 4 is a perspective view of a parallel plate and electrodes of a semiconductor device according to a modification example of the second preferred embodiment.

The metal plate may also be disposed at the position on the flat plate 12 corresponding to the end portion of the electrode 2 at the side of the electrode 1. FIG. 4 is a perspective view of the parallel plate 10 and the electrodes 1 and 2 of a semiconductor device according to a modification example of the second preferred embodiment.

As shown in FIG. 4, the semiconductor device further includes a metal member 18. The metal member 18 is made up of a non-magnetic material such as copper or aluminum alloy. The metal member 18 has a larger outline than the electrode 2 in a plane view, that is to say, the metal member 18 is formed longer than the electrode 2 and is fixed in contact with the rear surface of the electrode 2. The metal plate 8 is composed of part of the metal member 18. More specifically, part of the metal member 18 at a side of the electrode 1 is vertically bent downward to form the metal plate 8. The two metal plates 7 and 8 are disposed to face each other, and vertical surfaces of the two metal plates 7 and 8 face each other.

As described above, the semiconductor device according to the modification example of the second preferred embodiment includes the two metal plate 7 and 8, and the two metal plates 7 and 8 are disposed to correspond to the two electrodes 1 and 2. Thus, the self-inductance of the semiconductor device can be further reduced in comparison with a case of arranging only the metal plate 7.

The two metal plates 7 and 8 are disposed to face each other, so that the magnetic flux which tends to get away from the electrodes 1 and 2 can be blocked, and thus the self-inductance of the semiconductor device can be further reduced.

Third Preferred Embodiment

Figure 5:
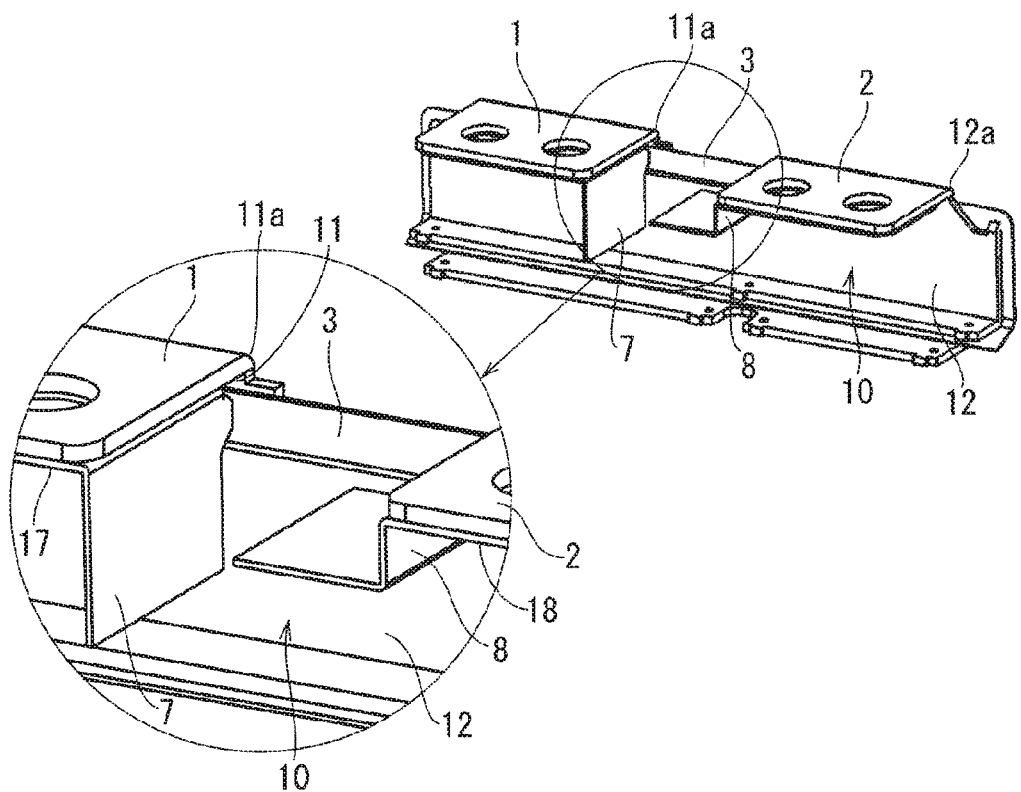
FIG. 5 is a perspective view of a parallel plate and electrodes of a semiconductor device according to a third preferred embodiment.
Figure 6:
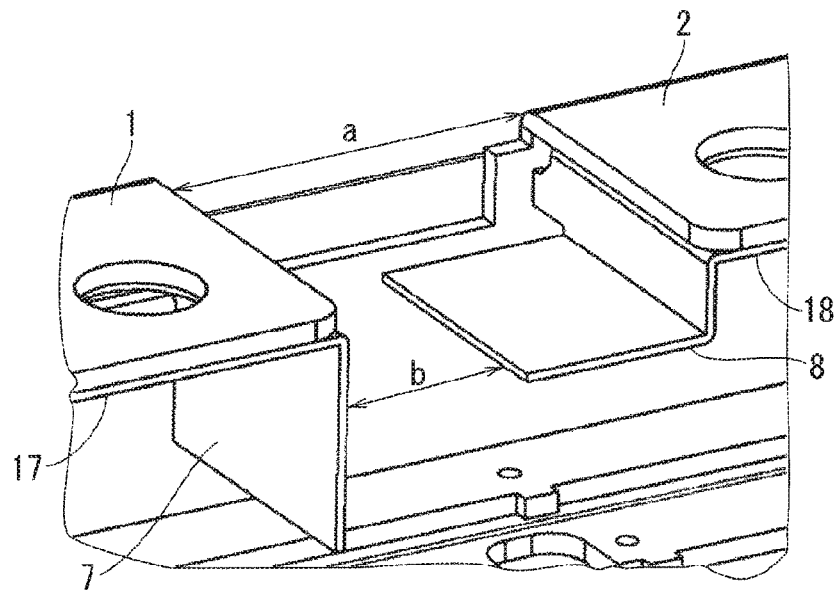
FIG. 6 is an enlarged perspective view of a portion between electrode lead-out portions of the semiconductor device according to the third preferred embodiment.
Figure 7:
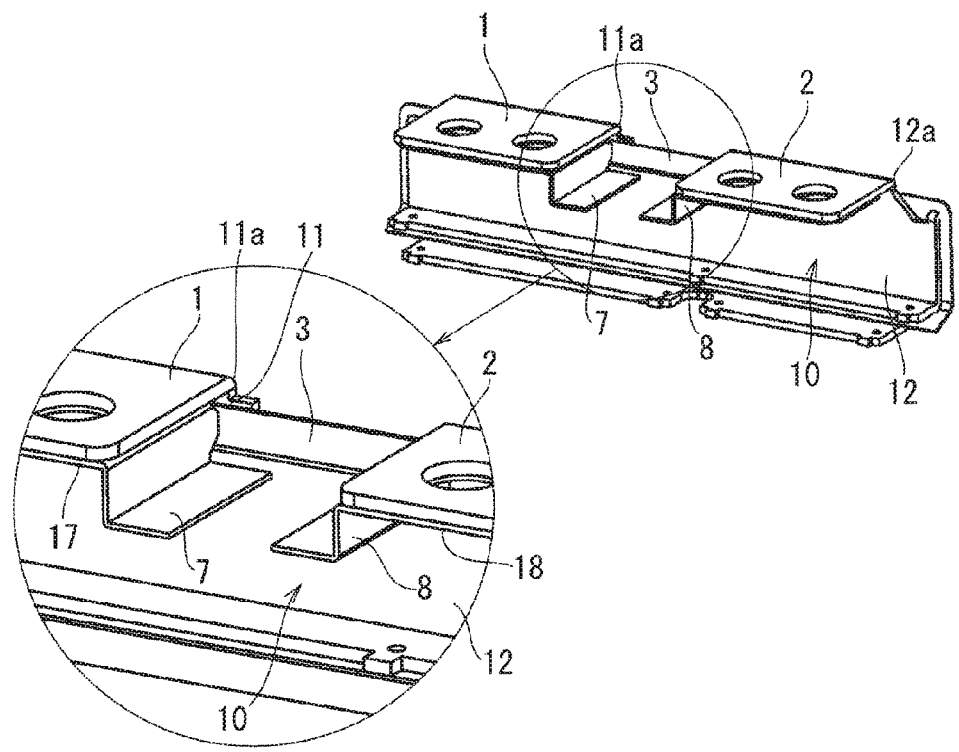
FIG. 7 is a perspective view of a parallel plate and electrodes of a semiconductor device according to a modification example of the third preferred embodiment.

Next, a semiconductor device according to a third preferred embodiment is described. FIG. 5 is a perspective view of the parallel plate 10, the electrode 1, and the electrode 2 of the semiconductor device according to the third preferred embodiment. FIG. 6 is an enlarged perspective view of a portion between the electrode lead-out portions 11a and 12a of the semiconductor device according to the third preferred embodiment. FIG. 7 is a perspective view of the parallel plate 10 and the electrodes 1 and 2 of a semiconductor device according to a modification example of the third preferred embodiment. In the third preferred embodiment, the same components as those described in the first and second preferred embodiments are denoted by the same references, which are not described here.

In the third preferred embodiment, at least one of the two metal plates 7 and 8 is disposed so that an edge portion of the two metal plates 7 and 8 is closer to the other metal plate in comparison with the base end portion of the two metal plates 7 and 8. In particular, as shown in FIG. 5, the metal plate 8 is bent at a center of the metal plate 8 in a vertical direction toward the side of the electrode 1, so that the edge portion is closer to the other metal plate 7 in comparison with the base end portion. Thus, as shown in FIG. 6, a distance b between the two metal plates 7 and 8 is smaller than a distance a between the two electrodes 1 and 2.

Not only the metal plate 8 but also the metal plate 7 may be bent toward the side of the electrode 2. In particular, as shown in FIG. 7, the metal plate 7 is bent at a center of the metal plate 7 in a vertical direction toward the side of the electrode 2, so that the edge portion is closer to the other metal plate 8 in comparison with the base end portion.

As described above, in the semiconductor device according to the third preferred embodiment and the modification example of the third preferred embodiment, at least one of the two metal plates 7 and 8 is disposed so that the edge portion is closer to the other metal plate in comparison with the base end portion. Thus, the magnetic flux can be made to detour, and the self-inductance of the semiconductor device can be further reduced. Although it is necessary to arrange the metal plates 7 and 8 in a vicinity of the base end portions of the electrodes 1 and 2, a reduction effect of the self-inductance is enhanced by making the magnetic flux blocked in the above portion detour. However, since there exist restrictions in a creepage distance and a space distance between different electrodes, the electrodes cannot simply be brought close to each other. As a method of achieving the above object, at least one of the two metal plates 7 and 8 is disposed so that the edge portion is closer to the other metal plate in comparison with the base end portion, for a purpose of bring the metal plates 7 and 8 surrounded by the lid 6, which is an insulating material, close to each other.

The distance b between the two metal plates 7 and 8 is smaller than the distance a between the two electrodes 1 and 2, so that the increase in the concentration of the magnetic flux is prevented and the self-inductance of the semiconductor device can be further reduced.

Fourth Preferred Embodiment

Figure 8:
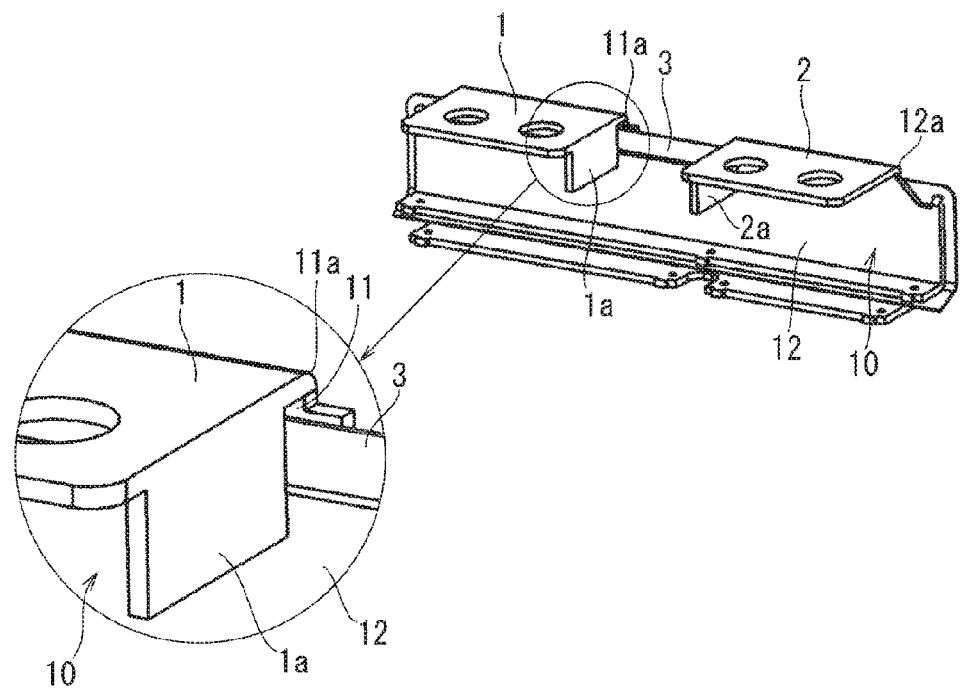
FIG. 8 is a perspective view of a parallel plate and electrodes of a semiconductor device according to a fourth preferred embodiment.
Figure 9:
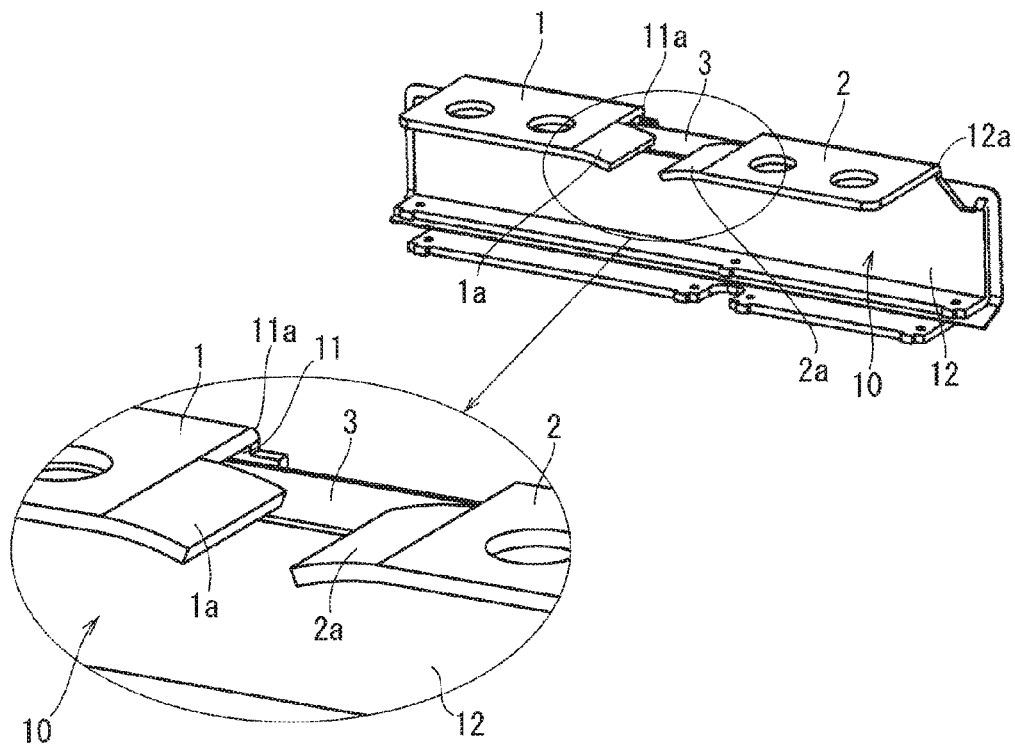
FIG. 9 is a perspective view of a parallel plate and electrodes of a semiconductor device according to a modification example of the fourth preferred embodiment.

Next, a semiconductor device according to a fourth preferred embodiment is described. FIG. 8 is a perspective view of the parallel plate 10, the electrode 1, and the electrode 2 of the semiconductor device according to the fourth preferred embodiment. FIG. 9 is a perspective view of the parallel plate 10, the electrode 1, and the electrode 2 of the semiconductor device according to a modification example of the fourth preferred embodiment. In the fourth preferred embodiment, the same components as those described in the first to third preferred embodiments are denoted by the same references, which are not described here.

In the fourth preferred embodiment, the metal plates 1*a* and 2*a* are composed of part of the electrodes 1 and 2. More specifically, as shown in FIG. 8, the metal plate 1*a* is formed by bending the part of the electrode 1 at the side of the electrode 2 downward, and the metal plate 2*a* is formed by bending the part of the electrode 2 at the side of the electrode 1 downward.

As described above, in the semiconductor device according to the fourth preferred embodiment, the metal plates 1*a* and 2*a* are composed of the part of the electrodes 1 and 2, so that the self-inductance of the semiconductor device can be reduced in a manner similar to the case of arranging the metal plates 7 and 8. Moreover, there is also an advantage that the number of components is reduced in comparison with the case of arranging the metal plates 7 and 8.

The metal plates 1*a* and 2*a* may also be formed to be inclined with respect to the electrodes 1 and 2, respectively. FIG. 9 is a perspective view of the parallel plate 10, the electrode 1, and the electrode 2 of the semiconductor device according to the modification example of the fourth preferred embodiment. As shown in FIG. 9, the metal plate 1*a* is formed to be inclined more downward as the metal plate 1*a* gets closer to the side of the electrode 2, and the metal plate 2*a* is formed to be inclined more downward as the metal plate 2*a* gets closer to the side of the electrode 1.

As described above, in the semiconductor device according to the modification example of the fourth preferred embodiment, the metal plates 1*a* and 2*a* are formed to be inclined with respect to the electrodes 1 and 2, so that an insulation wall can easily be disposed on the inclined portion, and the metal plates 1*a* and 2*a* can be brought closer to the other electrodes 2 and 1, respectively, while satisfying the creepage distance and the space distance.

Fifth Preferred Embodiment

Figure 10:
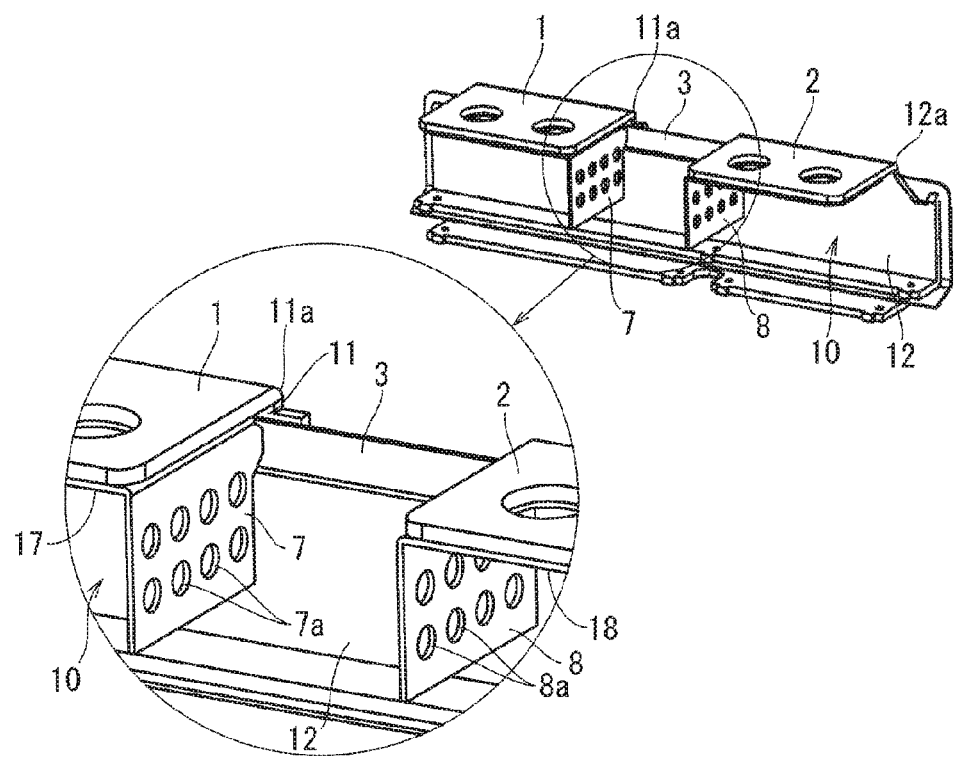
FIG. 10 is a perspective view of a parallel plate and electrodes of a semiconductor device according to a fifth preferred embodiment.

Next, a semiconductor device according to a fifth preferred embodiment is described. FIG. 10 is a perspective view of the parallel plate 10 and the electrodes 1 and 2 of the semiconductor device according to the fifth preferred embodiment. In the fifth preferred embodiment, the same components as those described in the first to fourth preferred embodiment are denoted by the same references, which are not described here.

In the fifth preferred embodiment, as shown in FIG. 10, a plurality of circular through holes 7*a* and 8*a* are provided in the metal plates 7 and 8, respectively. When the metal plates 7 and 8 are insert-molded in the resin case 5, a fluidity of the resin during the insert-molding is enhanced by providing the through holes 7*a* and 8*a*. The number of the through holes 7*a* and 8*a* are not limited to two or more, however, single hole may also be provided in the metal plates 7 and 8, respectively.

The metal plate 7 in FIG. 2 described in the first preferred embodiment may also be insert-molded in the lid 6*a* of the resin case 5. When the metal plate 7 is insert-molded in the lid 6*a* of the resin case 5, the metal plate 7 can be easily disposed in a region at a predetermined interval between the two electrode lead-out portions 11*a* and 12*a*.

In the above case also, the fluidity of the resin during the insert-molding can be enhanced by providing a through hole in the metal plate 7. Moreover, since the metal plate 7 has elasticity, a nut which is used when the lid 6*a* is attached to the resin case 5 can be outsert-molded.

The lid 6*a* is replaceably constituted with respect to the resin case 5, so that when the metal plate 7 is insert-molded in the lid 6*a* of the resin case 5, the metal plate 7 as well as the lid 6*a* can be replaced with respect to the resin case 5. Once preparing the lid 6*a* in which the metal plate 7 is insert-molded and the lid 6*a* in which only one of the metal plate 7 and the metal plate corresponding to the electrode 2 is insert-molded, both a product which gives priority to the self-inductance reduction and a product which gives priority to the manufacturing cost can be easily achieved just by changing the lid 6*a*.

As described above, in the semiconductor device according to the fifth preferred embodiment, when the metal plate 7 is insert-molded in the lid 6*a* of the resin case 5, the metal plate 7 can be easily disposed in a region at a predetermined interval between the two electrode lead-out portions 11*a* and 12*a*.

The through holes 7*a* and 8*a* are provided in the metal plates 7 and 8, so that the fluidity of the resin during the insert-molding can be enhanced.

The metal plate 7 has the elasticity, so that a nut which is used when the lid 6*a* is attached to the resin case 5 can be outsert-molded.

The lid 6*a* is replaceably constituted with respect to the resin case 5, so that once preparing the lid 6*a* in which the metal plate 7 is insert-molded and the lid 6*a* in which only one of the metal plate 7 and the metal plate corresponding to the electrode 2 is insert-molded, both the product which gives priority to the self-inductance reduction and the product which gives priority to the manufacturing cost can be easily achieved just by changing the lid 6*a*.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a resin case that houses a semiconductor element;
   a parallel plate that is disposed inside said resin case while being connected with said semiconductor element, said parallel plate including two flat plates parallel to each other with an insulating material therebetween;
   two electrodes that are each led out from two electrode lead-out portions in an upper end of said parallel plate and are disposed on an upper surface of said resin case at a predetermined interval, said two electrodes extending out from said two electrode lead-out portions in a direction substantially perpendicular to a main surface of at least one flat plate of said two flat plates, said main surface of at least one flat plate of said two flat plates extending in a direction parallel to said two flat plates; and
   a metal plate that stands erect on said main surface of at least one flat plate of said two flat plates in a region at said predetermined interval between said two electrode lead-out portions.

2. The semiconductor device according to claim 1, wherein said metal plate is disposed in contact with at least one electrode of said two electrodes.

3. A semiconductor device, comprising:
   a resin case that houses a semiconductor element;
   a parallel plate that is disposed inside said resin case while being connected with said semiconductor element, said parallel plate including two flat plates parallel to each other with an insulating material therebetween;
   two electrodes that are each led out from two electrode lead-out portions in an upper end of said parallel plate and are disposed on an upper surface of said resin case at a predetermined interval; and
   a metal plate that stands erect on a main surface of at least one flat plate of said two flat plates in a region at said predetermined interval between said two electrode lead-out portions,
   wherein a distance between said metal plate and at least one electrode of said two electrodes is 1 mm or less such that self-inductance of said semiconductor device can be reduced.

4. The semiconductor device according to claim 2, wherein said semiconductor device includes another metal plate and
   said metal plate and said another metal plate are disposed to correspond to said two electrodes, respectively.

5. The semiconductor device according to claim 4, wherein at least one of said metal plate and said another metal plate is disposed so that an edge portion is closer to the other of at least one of said metal plate and said another metal plate in comparison with a base end portion connected to the respective two electrodes.

6. The semiconductor device according to claim 4, wherein a distance between said metal plate and said another metal plate is smaller than a distance between said two electrodes.

7. The semiconductor device according to claim 4, wherein said two metal plates are disposed to face each other.

8. The semiconductor device according to claim 1, wherein said metal plate is composed of part of at least one electrode of said two electrodes.

9. The semiconductor device according to claim 8, wherein said metal plate is formed to be inclined with respect to at least one electrode of said two electrodes.

10. The semiconductor device according to claim 1, wherein a thickness of said metal plate is smaller than that of each electrode of said two electrodes.

11. The semiconductor device according to claim 1, wherein said metal plate is insert-molded in a lid of said resin case.

12. The semiconductor device according to claim 11, wherein a through hole is provided in said metal plate.

13. The semiconductor device according to claim 11, wherein said metal plate has elasticity.

14. The semiconductor device according to claim 11, wherein said lid is removably connected to said resin case.

15. The semiconductor device according to claim 1, wherein said semiconductor device further includes a metal member that is disposed in contact with a rear surface of at least one electrode of said two electrodes, said metal member having a larger outline than said at least one electrode of said two electrodes in a plane view, and
   said metal plate is composed of part of said metal member.

16. The semiconductor device according to claim 1, wherein said metal plate is removably connected to said at least one flat plate of said two flat plates.

17. The semiconductor device according to claim 1, wherein said metal plate is softer than at least one electrode of said two electrodes.

18. The semiconductor device according to claim 3, wherein a thickness of said metal plate is smaller than that of each electrode of said two electrodes.

* * * * *